United States Patent [19]

Krishna et al.

[11] 3,769,563

[45] Oct. 30, 1973

[54] HIGH SPEED, HIGH VOLTAGE TRANSISTOR

[75] Inventors: Surinder Krishna, Greensburg; John R. Davis, Export, both of Pa.

[73] Assignee: Westinghouse Electric Corporation, Pittsburgh, Pa.

[22] Filed: May 3, 1972

[21] Appl. No.: 249,981

[52] U.S. Cl...... 317/235 R, 317/234 S, 317/235 AJ
[51] Int. Cl. .............................................. H01l 5/00
[58] Field of Search ............................. 317/235, 234

[56] References Cited

UNITED STATES PATENTS

| | | | |
|---|---|---|---|
| 3,186,879 | 6/1965 | Schnable | 148/1.5 |
| 3,322,581 | 5/1967 | Hendrickson et al. | 148/175 |
| 3,088,888 | 5/1963 | Leff | 204/143 |

*Primary Examiner*—John S. Heyman
*Assistant Examiner*—E. Wojciechowicz
*Attorney*—F. Shapoe et al.

[57] ABSTRACT

A high voltage transistor with high switching speed is provided by a semiconductor body having a thin internal portion and a thick integral peripheral portion. The thin internal portion has a substantially uniform width of greater than about 28 microns and oppositely facing surface areas each of greater than about 0.10 $cm^2$. The thick peripheral portion has a width greater than about 150 microns and an annular dimension, i.e. radial width, greater than 10 microns but less than the corresponding radial dimension of the internal portion.

The collector region at the thin internal portion has a width greater than about 20 microns, a reverse breakdown voltage greater than its reach-through voltage, an impurity concentration less than $8 \times 10^{14}$ atoms/$cm^3$, and a minority carrier diffusion length at least an order of magnitude greater than the width of the collector region at the internal portion. The collector region at the thick peripheral portion has a width at least 20 percent greater than its width at the internal portion.

3 Claims, 12 Drawing Figures

PATENTED OCT 30 1973 3,769,563

HIGH SPEED, HIGH VOLTAGE TRANSISTOR

FIELD OF THE INVENTION

The present invention relates to semiconductor devices and specifically transistors.

BACKGROUND OF THE INVENTION

Junction transistors are old and well known in the art. They have emitter and collector regions formed by one conductive type of impurity, and a base region formed by the opposite conductive type of impurity. The emitter and collector regions adjoin opposite major surfaces of a semiconductor body and the base region is partially in the interior portion of the semiconductor body between the emitter and collector regions. Thus, two PN junctions are formed, one by the transition from the emitter to base regions and one by the transition from the collector to base regions.

The voltage capacity of a transistor is dependent on the reverse breakdown voltage at the PN junction between the base and collector regions. The breakdown voltage in turn is a function of the width and the impurity concentrations of the adjoining regions. For high voltage capacity, the base region generally has an impurity concentration at least an order of magnitude greater than the collector region so that the bias voltage is supported by a carrier depletion region primarily in the collector region. The voltage capacity is extended by merely reducing the impurity concentrations and increasing the width of the collector region.

The problem is that these factors also increase the stored charge in the collector region that must be removed by diffusion and recombination. Thus the storage time, i.e. the time to remove the stored charge, is necessarily long with the storage time ($t_s$) being proportional to the square of the width ($W_c$) of the collector region. Therefore, it has been very difficult to make a high voltage transistor (i.e., above 400 volts) with high switching speed and appendent high frequency capability. Irradiation and gold doping techniques have been used to advantage to provide high speed, high voltage transistors. But even such special techniques have resulted in high collector saturation voltages and in turn high power dissipation.

Another problem in high voltage semiconductor devices is channelling effects at the periphery of the semiconductor body. Channelling is localized voltage breakdown at a much lower voltage than will be permitted by the reverse breakdown voltage across the carrier depletion region in the bulk of the body. It is believed to be caused by surface charge and damage to the atomic lattice at the side surfaces of the semiconductor body. One way of reducing channelling has been to form a recess in the internal portion of the voltage supporting region of the device so that the collector reach-through voltage at the recess is much lower than the reverse breakdown voltage at the periphery of the body. Exemplary are the disclosures of U.S. Pat. Nos. 3,099,591 and 3,370,209. The effect is a high voltage semiconductor device with a voltage capacity corresponding to the voltage across the carrier depletion region at the internal portion.

The solution to the channelling problem has not however solved the switching speed problem in high voltage transistors. The recess formed in the internal portion of the semiconductor body is relatively shallow, bowl-shaped and/or resulted in annularly wide peripheral portions. Available mask techniques permit only very shallow etches or somewhat deep etches with a large annular peripheral portion; the available etchant resists peel or breakdown after a short period of exposure to an etchant causing the masked portion of the semiconductor to be attached. Deep etches can be attained without the attack on the peripheral portion by the jet-etch technique, see U.S. Pat. Nos. 2,885,571 and 2,921,362. But a bowl-shaped and irregular internal portion rather than an internal portion of substantially uniform width and relatively large surface area is necessarily formed. This results in erratic, current dependent storage times. Moreover, a high voltage transistor made by any of these techniques has a large amount of stored charge in the peripheral portion of the collector which must be removed by diffusion and recombination, and in turn its switching speed is relatively low.

The present invention oversomes these problems and difficulities. It makes possible a high voltage transistor with a uniform switching speed a factor of 10 or more better than prior high voltage transistors.

SUMMARY OF THE INVENTION

A high voltage transistor with high switching speed is provided in a semiconductor body of greater than about 150 microns in thickness that has a pair of opposed first and second major surfaces. The body has a thin internal portion with a substantially uniform width of greater than about 28 microns and oppositely facing surface areas each of greater than about 0.10 $cm^2$. The semiconductor body also has an integral thick peripheral portion with a width corresponding to the thickness of the body, and an annular dimension, i.e. radial width, greater than 10 microns but less than the corresponding radial dimension of the internal portion. An abrupt transition is hence made between the thin internal portion and the thick peripheral portion.

Base and emitter regions of impurities of opposite conductive types are sequentially formed, preferably by diffusion, adjoining first major surface which is preferably planar. Two PN junctions are thus formed — one between the emitter and base regions and one between the base and collector regions — with the PN junction between the collector and base regions in both the internal and peripheral portions, and the PN junction between the emitter and base regions preferably confined to the thin internal portion. The emitter region has a high impurity concentration, i.e., between about $1 \times 10^{18}$ and $1 \times 10^{21}$ atoms/$cm^3$. The base region impurity concentration is sufficiently high to provide current capacity but low enough to provide reasonably good ejection efficiency and gain (e.g., 20 to 100 ), i.e., between about $1 \times 10^{14}$ and $1 \times 10^{17}$ atoms/$cm^3$. Typically the base also has a minority carrier diffusion length at least an order of magnitude greater than its width.

The collector region of the transistor is formed adjacent the second major surface and has the same conductive type of impurities as the emitter region. It has a width greater than about 20 microns at the internal portion, a reverse breakdown voltage greater than its reach-through voltage at the internal portion, an impurity concentration less than $8 \times 10^{14}$ atoms/$cm^3$, and a minority carrier diffusion length at least an order of magnitude greater than its width at the internal portion. The ratio of the collector width at the peripheral portion to the collector width at the internal portion is at least 1.2 and increases as the voltage capacity of the transistor increases. As previously explained, the annular dimension of the collector region at the peripheral portion is less than the corresponding radial dimension at the internal portion to minimize the stored charge in the peripheral portion. The annular dimension must, however, be at least 10 microns to provide the required handling requirements for the transitor during its manufacture.

Preferably, the transistor is made from a doped semiconductor body or wafer made by epitaxial growth using standard techniques. The preselected or doped impurity concentration therethrough is less than 8 × $10^{14}$ atoms/$cm^3$ and corresponds to the desired voltage capacity of the transistor. The internal portion is subsequently formed by masking and etching by the method fully described in United States application Ser. No. 257,088, entitled "High Gain, Low Saturation Transistor," filed May 26, 1972. The active regions of the transistor, i.e., emitter, base and collector regions, are formed in the semiconductor body by diffusion techniques well established in the art. Alternatively, the active regions may be if desired grown into the body by varying the conductive type and concentration of the doping during epitaxial growth of the body.

Other details, objects and advantages of the invention will become apparent as the following description of a present preferred embodiment and a present preferred method of practicing the same proceeds.

BRIEF DESCRIPTION OF THE DRAWINGS

In the accompanying drawings, the present preferred embodiment of the invention and the present preferred method of practicing the invention is illustrated in which.

DESCRIPTION OF THE PREFERRED EMBODIMENTS

Figure 1:
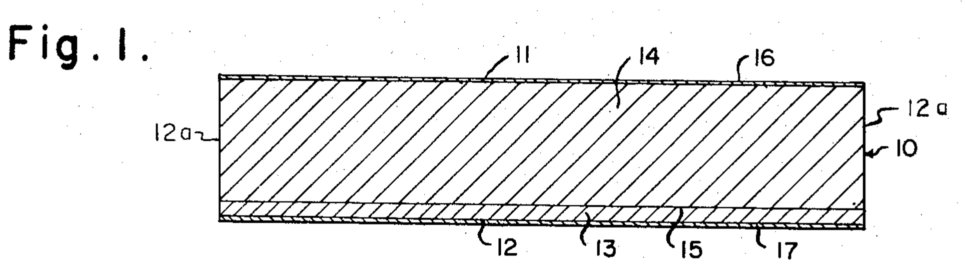
FIG. 1–7 are cross-sectional views in elevation through the center of a NPN transistor at various stages of manufacture.

Referring to FIG. 1, cylindrical silicon semiconductor body 10 of greater than about 150 microns in thickness (e.g., 470 microns and 1 inch in diameter) has a pair of opposed major surfaces 11 and 12, and curvilinear side surfaces 12*a*. Preferably semiconductor body 10 has a preselected N-type impurity concentration therethrough of less than about 8 × $10^{14}$ atoms/$cm^3$ (e.g. 3 × $10^{14}$ atoms/$cm^3$) formed therein during epitaxial growth of the body and corresponding to the voltage capacity desired in the transistor.

Semiconductor body has P+impurity region 13 and N−impurity region 14 with PN junction 15 therebetween which is formed by epitaxial growth or by diffusion. Preferably impurity regions 13 and 14 are formed by diffusing a P-type impurity (i.e., boron, gallium and/or aluminum) into the entirety of major surface 11 to the desired depth (e.g., 10 microns). The impurity most preferred is boron having a surface concentration of, for example, 1 × $10^{17}$ atoms/$cm^3$. The diffusion is performed in an inert atmosphere (e.g., argon) by procedures well established in the art, i.e., heating in a diffusion furnace in a closed or open quartz tube at about 1,200°C.

By way of explanation, it should be noted that a minus impurity region is a region having an impurity concentration at least one order of magnitude less than a related region having an impurity concentration of the same type impurity. For example, an N− impurity region would have an impurity concentration of N×type impurity of 1 × $10^{13}$ atoms/$cm^3$ or less for a related N impurity region with an impurity concentration of N−type impurity of 1 × $10^{14}$ atoms/$cm^3$. Conversely, a plus impurity region is a region having an impurity concentration at least one order of magnitude greater than a related region having an impurity concentration of the same type impurity. For example, an N+ dopant region would have an impurity concentration of N-type impurity of 1 × $10^{19}$ atoms/$cm^3$ or greater for a related N impurity region with an impurity concentration of N-type impurity of 1 × $10^{18}$ atoms/$cm^3$.

Oxide coatings 16 and 17 are formed over major surfaces 11 and 12 respectively to mask the surface for diffusion. The silicon oxide coatings may be formed subsequent to the formation of regions 13 and 14 by heating the body 10 in an oxygen-rich atmosphere such as steam or air. Coatings 16 and 17 may alternatively be formed simultaneously with the diffusion of P-impurity region 13 by performing the diffusion in an oxygen-rich atmosphere.

Figure 2:
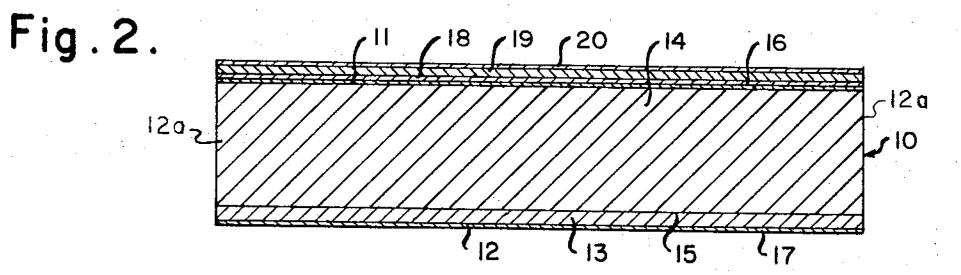

Referring to FIG. 2, bonding layer 18 of a metal having strong bonding properties to silicon and to other metals is formed over oxide coating 16. Suitable metals for this purpose are titanium, chromium, aluminum, zirconium, molybdenum, vanadium, columbium, tantalum, and tungsten. preferably bonding layer 18 is formed by depositing the metal by evaporation by procedures well known in the art to a thickness typically of about 500 Angstroms.

Vapor deposited metal layer 19 of a metal is subsequently formed over bonding layer 18 to form an adherent metal layer over oxide coating 16 on major surface 11. Preferably the metal selected should be resistant to various etchants that will etch the oxide coating 16 and 17 and the body 10, as well as be readily electroplatable. Suitable metals for the vapor dposited layer are the Group IB, VIA and VIII metals, and particularly gold, platinum, nickel, palladium and tungsten. Preferably, layer 19 is formed by depositing the metal by evaporation by procedures well known in the art to a thickness typically of about 2,000 Angstroms.

Thereafter a photomask layer 20 of a type well known in the art is placed over the metal layer 19.

Figure 3:
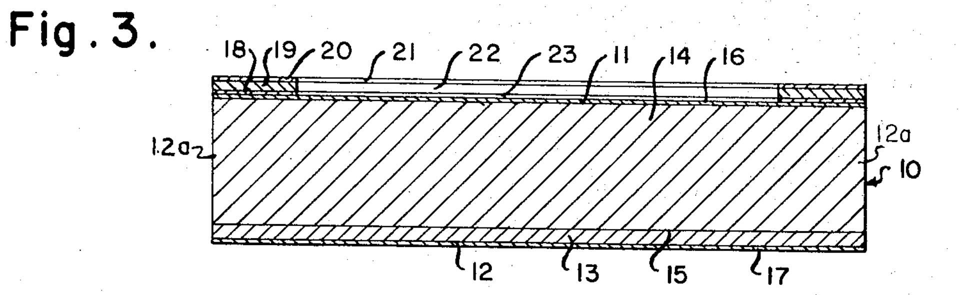

Referring to FIG. 3, corresponding windows 21, 22 and 23 are provided in layers 20, 19 and 18, respectively, to expose selected internal areas of oxide coating 16. Window 21 is formed in photomask layer 20 by methods well-known in the art, e.g., masking the selected internal portions; exposing the remaining peripheral portions to light to make these portions water-insoluble; and washing away the unmasked watersoluble portions to leave window 21 in selected internal portions of photomask layer 20.

Window 22 is then formed by etching through vapor deposited metal layer 19 with a suitable etchant to which photomask layer 20 and bonding layer 18 are resistant. Such etchants vary with the specific metal selected to form layer 19 and are well known to those skilled in the art. For example, a widely used recipe to etch gold is an aqueous solution having 3 parts hydrochloric acid, 1 part nitric acid and 4 parts water.

Thereafter, window 23 is formed in bonding layer 18 by etching through layer 18 with a suitable etchant without attacking the oxide coating 16, the body 10 and other layers. Such etchants also vary with the metal selected to form layer 18, and are widely known and used in the art. For example, a recipe used to etch titanium is a buffered aqueous solution having 1 part ammonium fluoride, 2 parts hydrochloric acid and 5 parts water.

Figure 4:
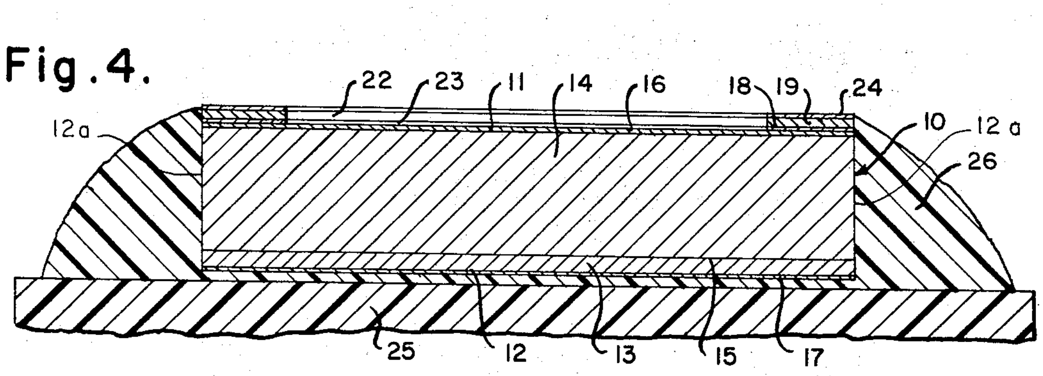

Referring to FIG. 4, photomask layer 20 is removed and etchant resistant metal layer 24 is electroplated over the remainder of layer 19 by well-known methods typicically to a thickness from 500 to 10,000 Angstroms and possibly on the order of 2 mils. Etchant resistant layer 24 may be formed by the same metal used to form layer 19. The electroplating closes pin holes formed in the layer 19 during the preceding etching steps and forms a continuous etchant resistant coating for the subsequent deep etching step.

Thereafter, the remaining exposed surfaces 12 and 13 are masked. A low solid wax such as Apiezon, paraffin or a dental wax is spread over substrate 25 (e.g., one-eighth to one-fourth inch in thickness) of polytetrafluoroethylene, stainless steel coated with gold or glass. The prepared semiconductor body 10 is then embedded in the wax, and the wax solidified to form protective coating 26 over surfaces 12 and 13.

Figure 5:
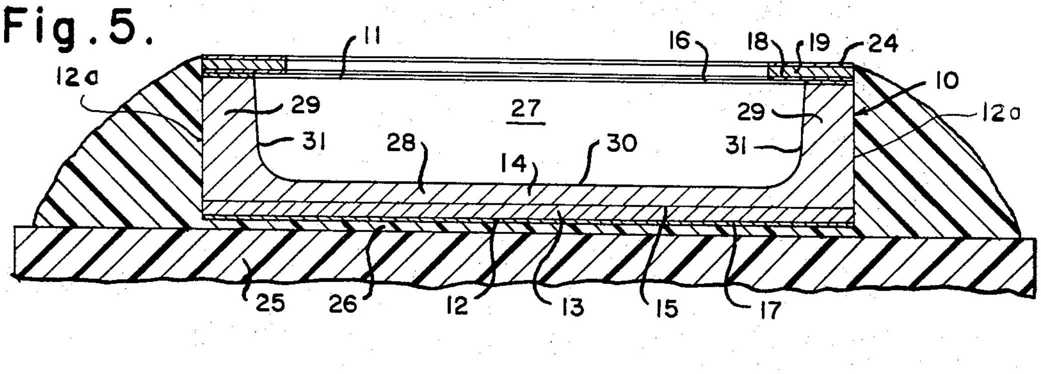

Referring to FIG. 5, well 27 is etched in semiconductor body 10 to provide body 10 with thin internal portion 28 and a thick peripheral portion 29. Body 10 is immersed in an etchant suitable for etching body 10 and resistant to layer 24, and continuously agitated under carefully adjusted conditions to provide well 27 with a substantially flat foundation surface 30 that is substantially parallel to major surface 12. The composition of the etchant will vary with the composition of body 10 and coating 24. A suitable etchant for etching silicon semiconductor bodies coated with gold is an acid solution having 3 parts hydrofluoric acid, 5 parts acetic acid and 15 parts nitric acid. Adjustments and conditions for obtaining flat foundations surface 30 are known in the art, e.g., turning the container and solution in which body 10 is immersed on an obliquely positioned turntable at a few revolutions per minute.

By precisely controlling the etching conditions (i.e. the concentration of the etchant, length of etching and agitation rate) the dimensions of well 27 and in turn internal portion 28 can be precisely controlled. Internal portion 28 has a substantially uniform width of greater than about 28 microns (for 400 volts capacity) and preferably greater than about 94 microns (for 1,000 volts), e.g., 190 microns (3,000 volt capacity), and opposed surfaces each of greater than 0.10 $cm^2$ in area. Peripheral portion 29 is the width of the starting semiconductor body 10 (e.g., 470 microns) so that there is an abrupt transition from internal portion 28 to peripheral portion 29 at the transition from foundation surface 30 to curvilinear sidewalls 31, which approach parallelity with side surfaces 13.

In this procedure, the annular dimension of the peripheral portion 29 is also precisely controlled by the size of windows 21, 22 and 23 and the etching rate. As shown, the annular dimensions, i.e. radial width, is less than the corresponding radial dimension of the internal portion and preferably as small as practicable to minimize the stored charge in the peripheral portion and in turn increase the switching speed of the transistor. The annular dimension of the peripheral portion 28 must, however, be at least about 10 microns to provide the handling requirement needed in the manufacture of the transistor.

Figure 6:
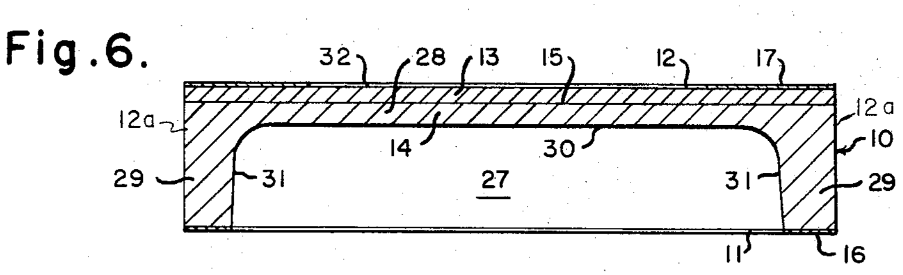

Referring to FIG. 6, metal layers 18, 19 and 24, protective coating 26 and substrate 25 are removed. Layers 18, 19 and 24 are removed by a repetition of the etching steps above described in forming windows 22 and 23. Protective coating 26 and substrate 25 are removed by liquifying the wax composition. The procedures also include cleaning, e.g., by etching, of major surface 12 to provide uniform, uncontaminated major surfaces on the semiconductor body 10.

Window 32 is then formed in silicon oxide coating 17 by methods, i.e. masking and etching, widely known in the art to expose internal portions of major surface 12.

Figure 7:
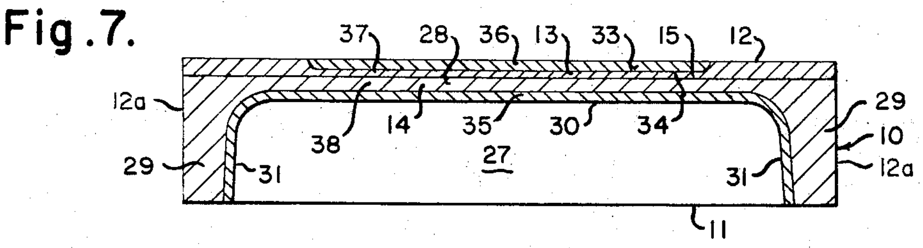

Referring to FIG. 7, N+ impurity region 33 is formed by diffusing an N-type impurity (i.e. phosphorus, antimony, and/or arsenic) into the exposed portions of major surface 12. The diffusion is accomplished by heating body 10 in an inert atmosphere containing an impurity producing compound, such as phosphine gas for phosphorus. The diffusion time is controlled to determine the concentration and penetration of the impurity. The diffusion is precisely controllable because the geometry of the body 10 permits the formation of a shallow (e.g., 5 microns), highly concentrated (e.g., $1 \times 10^{19}$ atoms/$cm^3$) emitter region. In any event, N+ impurity region 33 forms a PN junction 34 with P+ impurity 13 preferably limited to the internal portion 28 of body 10.

Also, second N+ impurity region 35 is formed, preferably simultaneously with N+ impurity region 33, by diffusion of N-type impurity into the exposed foundation surface 30 and sidewalls 31 to a desired depth (e.g., 5 microns). Impurity region 35 reduces the resistivity adjoining the surfaces and provides good ohmic contact to N-impurity region 14.

After diffusion, the remainder of the oxide coating is removed (e.g., by etching) to expose all surfaces of semiconductor body 10.

An alternative procedure is to mask for the diffusion of N+ impurity regions 33 and 35 after the thin internal portion 28 is formed by deep etching. To effect this the wafer or body 10 is coated with an oxide by heating body 10 in an oxygen-rich atmosphere such as steam or air after layers 18, 19 and 24 are formed on surface 11. The portions of major surface 11 adjoining peripheral portion 29 and selected peripheral portions of major surface 12 are then masked and the surfaces etched to expose foundation surface 30 and sidewalls 31 as well as selected internal portions of major surface 12. The above described procedure is then followed to, preferably simultaneously, diffuse N+ impurity regions 33 and 35 into the semiconductor body. This alternative, however, increases the number of production steps and the handling after internal portion 28 is formed, and in turn increases the number of rejects during production.

The NPN transistor thus formed has emitter region 36 corresponding to N+ impurity region 33, base region 37 coresponding to P+ impurity region 13, and collector region 38 corresponding to N-impurity region 14. Second N+ impurity region 35 is discounted in the transistor operation; it provides only good ohmic contact between collector region 38 and metal contact 41.

The reverse breakdown voltage of N- impurity region 14 is higher than the collector reach-through voltage at internal portion 28. The width of the collector region 38 at peripheral portion 29 is at least 20 percent greater than the collector width at internal portion 28. In turn, the channelling effects at side surfaces 13 are substantially reduced and the voltage capacity of the transistor is governed by the potential across the carrier depletion region at the internal portion of body 10 at collector reachthrough.

Figure 8:
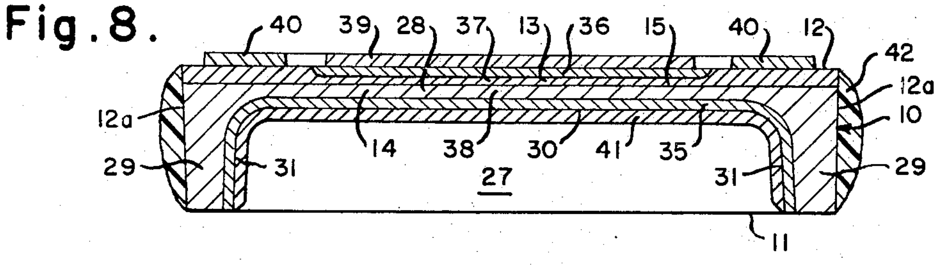
FIG. 8 is a cross-sectional view of a NPN transistor taken along line VIII—VIII of FIG. 9.

Referring to FIG. 8, metal contacts 39, 40 and 41 are affixed to semiconductor body 10 to make separate ohmic contacts with emitter region 36, base region 37 and collector region 38, respectively. Metal contact 39 is affixed to major surface 12 at internal portion 28 to contour emitter region 36, preferably as closely as possible and thereby optimize the current capacity of the transistor. Metal contact 40 is affixed in an annular shape to major surface 12 at peripheral portion 29. And metal contact 41 is affixed to contour foundation surface 30 and sidewalls 31; it may also, if desired, extend into peripheral portion 29 at major surface 11, where N+ impurity region 35 is extended correspondingly to provide good ohmic contact. As shown, metal contacts 39, 40 and 41 are formed by evaporating aluminum onto selective portions of the surfaces to a thickness typically of abour 70,000 to 1000,000 Angstroms, by first selectively masking the remaining portions of the surfaces with a material impervious to aluminum. Preferably, however, metal contact 41 is greater in thickness possibly to even fill-in well 27 completely to provide a heat sink for the transistor and in turn low, efficient operating temperatures in the transistor.

To complete the making of the transistor, body 10 is spin-etched by known procedures to taper side surfaces 12a to shape the electric fields found in the transistor and in turn further reduce edge leakage and localized voltage breakdown during operation. This tapering is important to reduce surface breakdown above 500 volts capacity and is essential above 2,000 volts capacity. Then side surfaces **12*a* are coated with a protective coating 41** formed by incorporating, for example 1,2-dihydroxyanthraquinone (also called "alizarin") alone or in a silicone or epoxy resin to substantially reduce atmospheric effects on the transistor.

Figure 9:
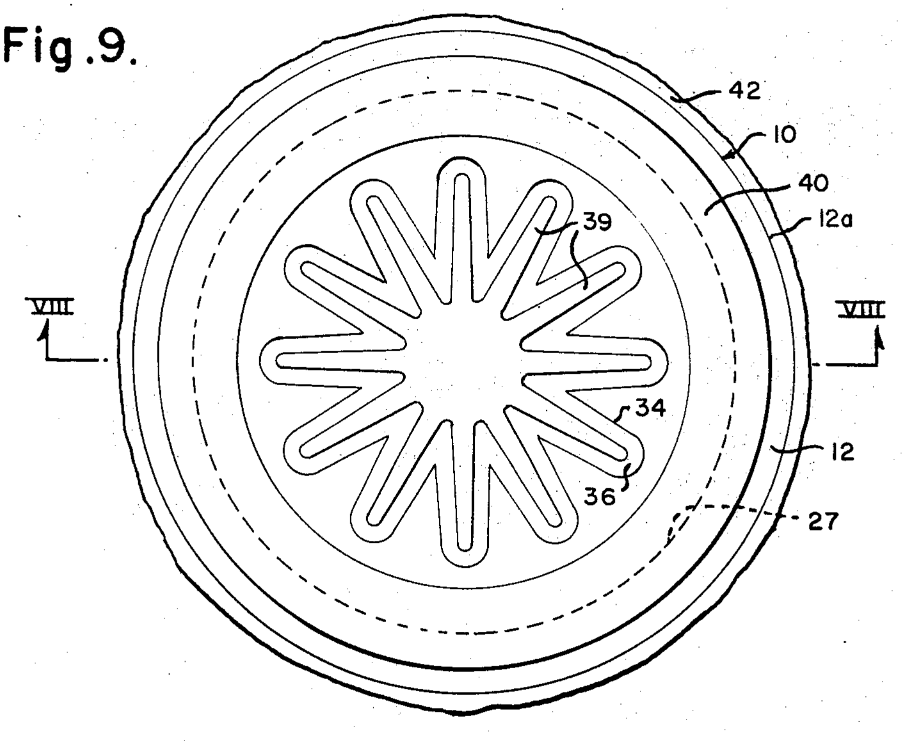
FIG. 9 is a top view of the NPN transistor shown in FIG. 8.

An NPN transistor shown in FIGS. 8 and 9 is thereby formed. Similarly, a PNP transistor can be formed by starting with semiconductor body 10 having a given level of P-type impurity therethrough. N- and P-type impurities can then be sequentially diffused into or epitaxially grown at major surfaces 12 to form the transistor.

Figure 10:
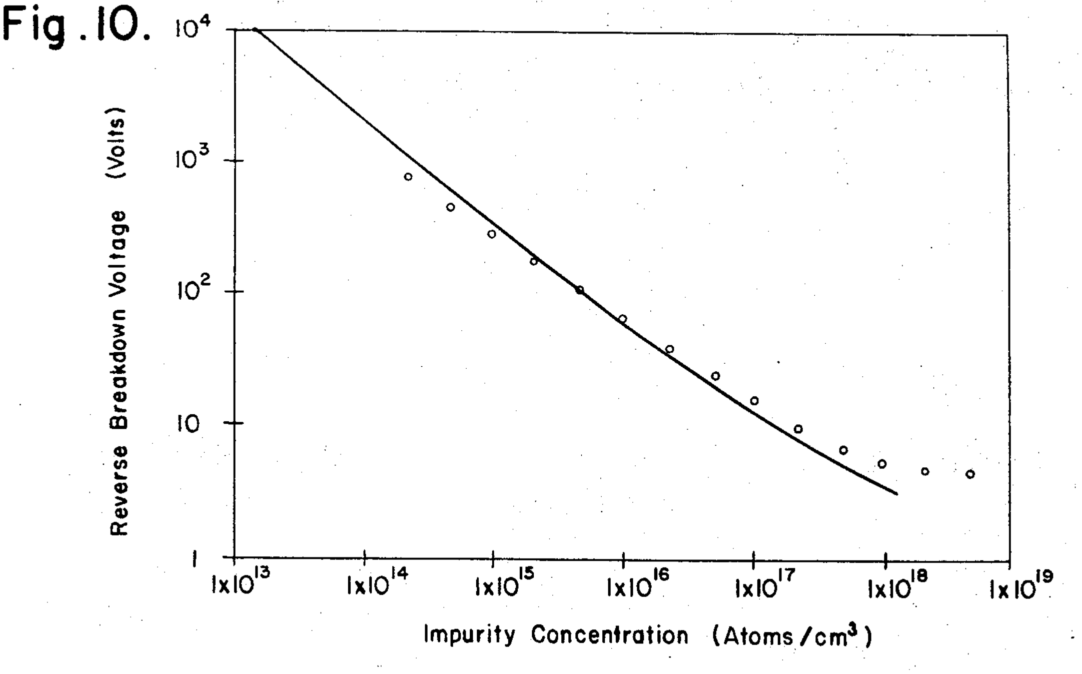
FIG. 10 is a graph showing experimental and calculated plots of collector region doping versus design voltage for silicon semiconductor material.
Figure 11:
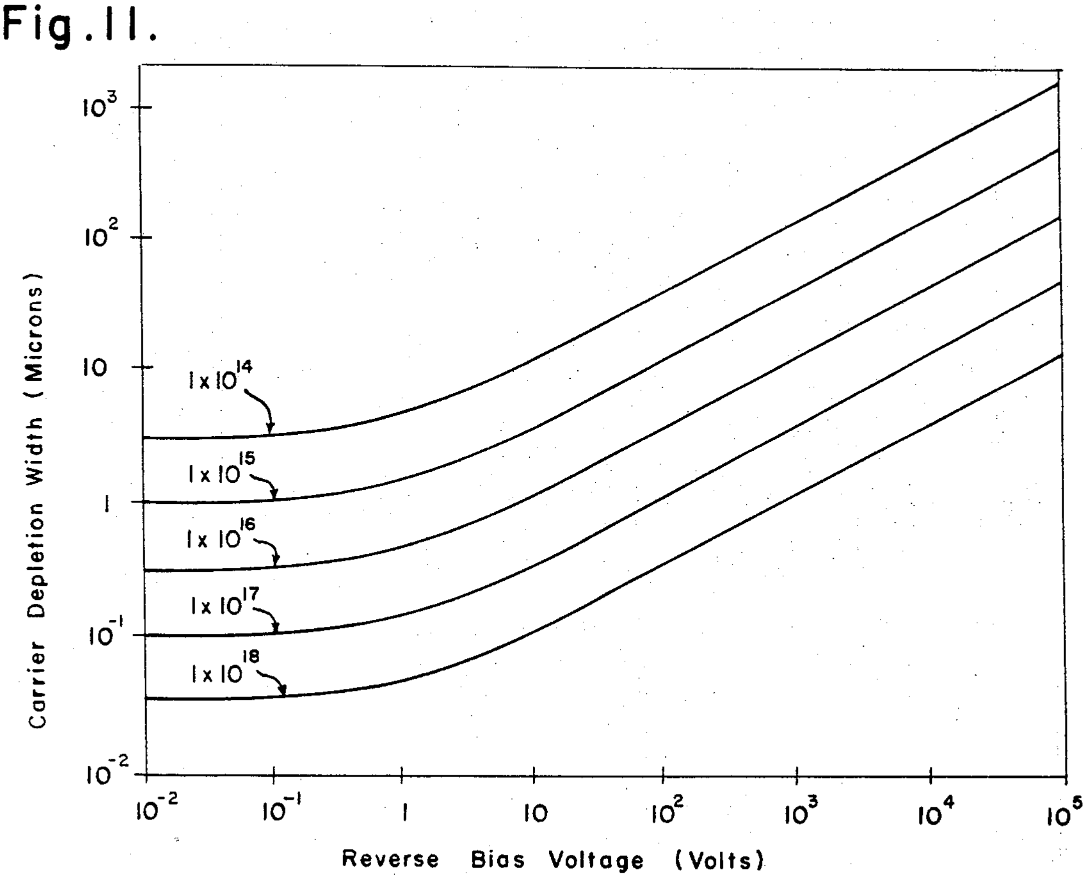
FIG. 11 is a graph showing a plot of collector region width versus design voltage assuming an abrupt step junction at the PN junction between the collector and base regions.
Figure 12:
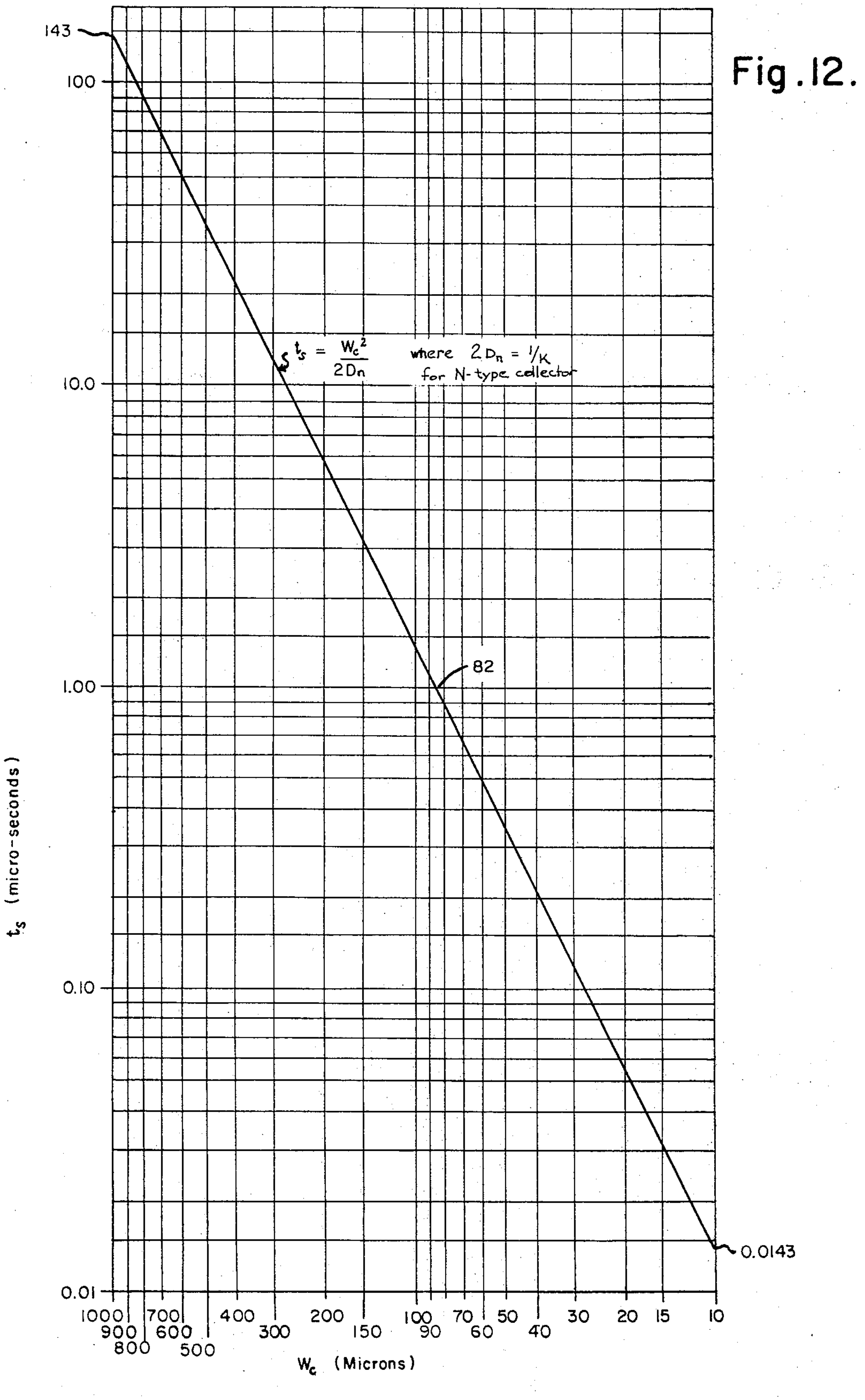
FIG. 12 is a logarithmic plot showing the change in storage time for changes in collector region width.

FIGS. 10, 11 and 12 provide for the design of a transistor of the desired electrical characteristics in accordance with the present invention. FIG. 10 shows the change in reverse breakdown voltage with change in impurity concentration for a one-sided step junction for silicon semiconductor material. The solid line is calculated based on ionization rates. The dotted line is experimentally measured values for silicon. It should be noted that a one-sided step junction assumes that the reverse breakdown voltage is sustained on one side of the junction and that the impurity concentration on the other side of the junction is infinitely large. The one-sided step junction provides a good approximation for the present invention because the impurity concentration in collector region 38 is typically several orders of magnitude less than the impurity concentration in base region 37. As shown from FIG. 10, the reverse breakdown voltage decreases in direct proportion to the increase in impurity concentration.

FIG. 11 shows the change in width of the carrier depletion region with changes in the reverse bias voltage across a PN junction in silicon at room temperature (i.e., 27°C.) for different impurity concentrations, i.e., from $1 \times 10^{14}$ to $1 \times 10^{18}$ atoms/cm$^3$. The plots are approximations based on a one-sided step junction. As shown, the width of the carrier depletion region increases slowly to a bias voltage of 1 volt and thereafter increases rapidly. The curve shifts downwardly one-half order of magnitude for each increase of impurity concentration by one order of magnitude.

FIG. 12 shows the change in switching speed for changes in collector width. It has been empirically found that where the carrier depletion region is primarily in the collector region (i.e., approximates a step-junction) the storage time ($t_s$) (i.e., the time to remove the stored charge on cut-off) is proportional to a square of the width of the collector region ($W_C$). Thus, $t_s = k W_c^2$. Typically $k$ ranges from 0.014 to 0.007 for an N-type collector region and from 0.035 to 0.0175 for a P-type collector region where $t_s$ is in seconds and $W_c$ is in centimeters. It can be seen from the relationship that storage time in the transistor of the present invention is independent of impurity concentration and dependent only on the width of the collector region in the internal portion 28.

The resulting transistor has its operation primarily in thin internal portion 28. Peripheral portion 29 functions only to maintain the voltage capacity of the transistor. The performance characteristics of the transistor can therefore be optimized. The impurity level in the starting semiconductor body 10 and the widths of the various regions can be selected to provide a collector reach-through condition in the internal portion 28 just below the design reverse breakdown voltage. No higher voltage capacity need be provided for safe operating conditions.

The speed capacity of the resulting transistor is particularly high and substantially uniform with changes in current. The minority carrier diffusion length being at least an order of magnitude greater than the width of the collector region 38 provides for instantaneous withdrawal of the stored charge in the collector region at internal portion 28 as well as part of the stored charge in the collector region at peripheral portion 29. In turn, part of the stored charge in the collector region at the peripheral portion collapses into the internal portion 28 upon withdrawal of the stored charge therein so that it can readily be pulled out of the transistor by the potential across the internal portion. Only a relatively small amount of the stored charge in the collector region at the peripheral portion need be disposed of by diffusion and recombination and therefore fast switching and high frequency capacity are provided. Futhermore, the uniform width of the collector region in internal portion 28 provides uniform switching speed substantially independent of the amount of current through the transistor.

The NPN transistor of FIGS. 8 and 9 with the desired electrical characteristics can thereby be designed by the selection of the desired current gain ($\beta$), current capacity (I), and breakdown voltage ($V_{CEO}$) or the switching time ($t$). For example, assume that in an NPN transistor the desired collector-emitter current gain $\beta$ is 75 and the desired collector-emitter saturation voltage (base open) $V_{CEO}$ is 400 volts. The required collector-base avalanche voltage (emitter open) can be calculated [$V_{CBO} = (\beta)^{1/3} V_{CEO}$] to be about 990 volts. From FIG. 10, the required level of impurity concentration of the collector region 38 and in turn the impurity level of semiconductor body 10 can be determined (i.e., about $1 \times 10^{14}$ atoms/cm$^3$). The impurity concentration established, the required carrier depletion width and in turn the width of the collector region 38 at the internal portion 28 on collection reach-through can be determined from FIG. 11 (i.e., approximately 120 microns).

Subsequently from FIG. 12, the switching speed is found to be a maximum of 2.0 microseconds where $k = 0.014$. This is for low level conditions where the charge density does not exceed the impurity concentration in the collector region. However, for high power transistor, a high level condition exists where the charge density is greater than the impurity concentration in the collector region. In the high level mode, $k$ is reduced to about 0.007 and in turn causes the switching speed to be even faster.

Thus, if the starting semiconductor body 10 is 475 microns in thickness, P+ impurity region 13 is 10 microns in thickness and the diffusion depths for the N+ impurity regions 33 and 35 are 5 microns each, well 27 is 280 microns in depth.

Likewise, the transistor can be designed for a given switching speed. The collector width can be determined from FIG. 12 and in turn the voltage capacity and impurity concentrations can be determined from FIGS. 10 and 11.

In either case, the voltage capacity and the switching speed of the transistor must be comprised one for the other as in prior devices. Transistors as high as 10,000 volts capacity are contemplated to be made by the present invention, the thickness of the starting semiconductor body is simply correspondingly larger, e.g., about 2,500 microns for 10,000 volts. The point is, however, that transistor of the present invention are for a given voltage capacity more than ten times faster in switching speed and have correspondingly higher frequency responses than prior transistors of the same voltage capacity.

The area of the oppositely facing surfaces of the thin internal portion 28 is determined for the desired current capacity. The maximum current density is governed by the high level injection condition which gives about $1 \times 10^4$ amps/cm$^2$. However, in practice much lower densities are used. Typically, for silicon, $j$ is about 300 amps/cm$^2$ or less if lower saturation voltage is desired. Thus the area is determined by $A = I/j$. For example, for 75 amperes capacity, the needed area of the opposite surfaces of internal portion 28 is determined to be 0.25 cm$^2$. The operating current is, however, well below the maximum, i.e., 50 amperes in the example.

While the presently preferred embodiments of the invention and methods for making them have been specifically described, it is distinctly understood that the invention may be otherwise variously embodied and used within the scope of the following claims.

What is claimed is:

1. A transistor comprising: a semiconductor body having first and second opposed major surfaces and thin internal and thick peripheral portions; said thin internal portion being of substantially uniform thickness of greater than about 28 microns and having opposed surfaces each of greater than about 0.10 cm$^2$ in area, and said thick peripheral portion being of thickness greater than 150 microns and having a radial width greater than about 10 microns but less than the corresponding radial dimension of the internal portion; an emitter region of high impurity concentration adjoining first major surface and being at least partially in the internal portion of the body; a collector region of impurity concentration less than $8 \times 10^{14}$ atoms/cm$^3$ formed by the same conductive type as the impurities of the emitter region adjoining second major surface at both the internal and peripheral portions, having a width at the internal portion of greather than 20 microns, having a reach-through voltage at the internal portion less than breakdown voltage, and having a width at te peripheral portion at least 20 percent greater than the width at the internal region; a base region of impurity concentration of conductive type opposite to the impurities of emitter and collector region provided partially in interior of the body between the emitter and collector regions and forming separate PN junctions therewith, and having a minority carrier diffusion length at the internal portion at least an order of magnitude greater than the width of the base region at the internal portion; and metal contacts affixed to the major surfaces of the body to make separate ohmic contact with the emitter and collector regions at least at the internal portion and with the base region at the peripheral portion.

2. A transistor as set forth in claim 1 wherein the first major surface of the body is planar.

3. A transistor as set forth in claim 1 wherein the emitter region is confined to the internal portion.

* * * * *